United States Patent
Katayama (10) Patent No.: US 9,698,475 B2
(45) Date of Patent: Jul. 4, 2017

(54) STRUCTURAL BODY AND WIRELESS COMMUNICATION APPARATUS

(71) Applicant: SHARP KABUSHIKI KAISHA, Osaka-shi, Osaka (JP)

(72) Inventor: Tomofumi Katayama, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 55 days.

(21) Appl. No.: 14/437,408

(22) PCT Filed: Jan. 23, 2014

(86) PCT No.: PCT/JP2014/051404
§ 371 (c)(1),
(2) Date: Apr. 21, 2015

(87) PCT Pub. No.: WO2014/148102
PCT Pub. Date: Sep. 25, 2014

(65) Prior Publication Data
US 2015/0288058 A1    Oct. 8, 2015

(30) Foreign Application Priority Data
Mar. 21, 2013    (JP) .................. 2013-059153

(51) Int. Cl.
| | | |
|---|---|---|
| H01Q 1/24 | (2006.01) |
| H01Q 1/38 | (2006.01) |
| H05K 1/02 | (2006.01) |
| H05K 1/03 | (2006.01) |
| H05K 1/11 | (2006.01) |
| H05K 1/16 | (2006.01) |
| H05K 3/00 | (2006.01) |
| H05K 3/20 | (2006.01) |

(52) U.S. Cl.
CPC ............... *H01Q 1/38* (2013.01); *H01Q 1/241* (2013.01); *H01Q 1/243* (2013.01); *H05K 1/0271* (2013.01); *H05K 1/0313* (2013.01); *H05K 1/115* (2013.01); *H05K 1/165* (2013.01); *H05K 1/0284* (2013.01); *H05K 3/0014* (2013.01); *H05K 3/207* (2013.01); *H05K 2201/0999* (2013.01)

(58) Field of Classification Search
CPC ........... H01Q 1/243; H01Q 1/241; H01Q 1/38
USPC ....................................... 343/702
See application file for complete search history.

(56) References Cited

U.S. PATENT DOCUMENTS

| | | | |
|---|---|---|---|
| 6,783,652 B2* | 8/2004 | Iijima | H05K 3/045 205/125 |
| 2003/0196833 A1 | 10/2003 | Fujii et al. | |
| 2009/0015507 A1* | 1/2009 | Hong | H01Q 1/1207 343/873 |

(Continued)

FOREIGN PATENT DOCUMENTS

| | | |
|---|---|---|
| CN | 1454044 A | 11/2003 |
| JP | 2007-221513 A | 8/2007 |
| WO | WO 2010/098540 A2 | 9/2010 |

*Primary Examiner* — Dieu H Duong
(74) *Attorney, Agent, or Firm* — Birch, Stewart, Kolasch & Birch, LLP (57) ABSTRACT

A first resin layer (11) is provided with a first through hole (12), a conductive pattern (31, 41, 51) extends from a first surface of the first resin layer (11) to a second surface of the first resin layer (11) through the first through hole (12), and a second resin layer (21) is provided with a first protrusion (22) which fills at least a portion of the first through hole (12).

10 Claims, 6 Drawing Sheets

(56) References Cited

U.S. PATENT DOCUMENTS

2009/0322629 A1\* 12/2009 Hung ................ B29C 45/14065
343/702
2012/0287559 A1\* 11/2012 Park ....................... H01Q 1/243
361/679.01

\* cited by examiner

STRUCTURAL BODY AND WIRELESS COMMUNICATION APPARATUS

TECHNICAL FIELD

The present invention relates to a structure including a conductive pattern and a wireless communication apparatus including the structure

BACKGROUND ART

In recent years, a technique of forming a conductive pattern integrally with a housing has been developed so as to (i) reduce a thickness of an electronic device and (ii) simplify a configuration of the electronic device. For example, Patent Literature 1 discloses a casing of a wireless communication product including an antenna conductor circuit. The casing includes a conductive reserved area whose shape matches with a shape of the antenna conductor circuit. The antenna conductor circuit is formed in the reserved area by plating or an electro-casting method and then, is covered with a package material.

CITATION LIST

Patent Literature

Patent Literature 1
Japanese Patent Application Publication Tokukai No. 2007-221513 (Publication Date: Aug. 30, 2007)

SUMMARY OF INVENTION

Technical Problem

In the above technique, the casing and the package material can adhere to each other as a result of fusing to each other by melting at an interface of the casing and the package material. On the other hand, the antenna conductor circuit and the package material are difficult to adhere to each other at an interface between the antenna conductor circuit and the package material, because the antenna conductor circuit and the package material are less likely to fuse to each other by melting at the interface. Such difficulty in adhering the antenna conductor circuit and the package material occurs, because the antenna conductor circuit is covered by plating and a portion made by this plating does not melt. Therefore, the antenna conductor circuit and the package material are likely to peel off from each other at the interface between the antenna conductor circuit and the package material.

The present invention is attained in view of the above problem, and a main object of the present invention is to provide a technique for preventing a first resin layer and a second resin layer from peeling off from each other at a portion where a conductive pattern is provided in a structure including the conductive pattern between the first resin layer and the second layer.

Solution to Problem

In order to solve the problem, a structure according to one aspect of the present invention includes: a first resin layer on whose surface a conductive pattern is formed; and a second resin layer formed on the first resin layer so that the conductive pattern is sandwiched between the first resin layer and the second resin layer, the first resin layer being provided with a first through hole, the conductive pattern extending from a first surface of the first resin layer to a second surface of the first resin layer through the first through hole, the first surface being on a side provided with the second resin layer, the second surface being on an opposite side to the side provided with the second resin layer, the second resin layer having a first protrusion which fills at least a portion of the first through hole.

Advantageous Effects of Invention

According to one aspect of the present invention, at least a portion of the first through hole provided to the first resin layer is filled with the first protrusion of the second resin layer which is formed on the first resin layer. This causes the portion of the first through hole and the first protrusion to be as if the portion and the first protrusion were firmly engaged with each other. Accordingly, the first resin layer and the second resin layer are tightly adhered to each other. This yields an effect of preventing the first resin layer and the second resin layer from peeling off from each other at the portion where the conductive pattern is provided.

BRIEF DESCRIPTION OF DRAWINGS (a) of FIG. 1 is a partial-cutaway perspective cross-sectional view illustrating a schematic configuration of a structure of one embodiment (Embodiment 1) of the present invention and (b) of FIG. 1 is a magnified view of the vicinity of a through hole and a protrusion of the structure.

DESCRIPTION OF EMBODIMENTS

A structure of the present invention includes: a first resin layer on whose surface a conductive pattern is formed; and a second resin layer formed on the first resin layer so that the conductive pattern is sandwiched between the first resin layer and the second resin layer, the first resin layer being provided with a first through hole, the conductive pattern extending from a first surface of the first resin layer to a second surface of the first resin layer through the first through hole, the first surface being on a side provided with the second resin layer, the second surface being on an opposite side to the side provided with the second resin layer, the second resin layer having a first protrusion which fills at least a portion of the first through hole.

Further, a wireless communication apparatus of the present invention includes (i) a housing including the structure of the present invention and (ii) an antenna including the conductive pattern.

(Overview of Structure)

The structure of the present invention is incorporated into a general electronic device which requires a conductive pattern that functions as an antenna element, a signal transmission path, a power transmission path, and/or the like. Thereby, the conductive pattern is provided to the electronic device. For example, in one embodiment, the structure of the present invention is incorporated into a wireless communication apparatus so as to provide an antenna element of an antenna of the wireless communication apparatus. Alternatively, the structure of the present invention may be incorporated in, for example, an electronic device so as to provide (a) a signal transmission path, a power transmission path, and/or the like which connects a circuit substrate with other electronic component(s) and/or (b) a path which connects a circuit substrate with a ground.

Note that the structure of the present invention may be fixed to an electronic device or alternatively mounted to the electronic device in a detachable manner. The structure of one embodiment of the present invention may constitute at least a portion of a housing of the electronic device. In other words, the structure of the present invention can constitute a conductive-pattern-formed housing. Note that the term "housing" indicates a member in which electronic components of the electronic device are housed, and that the conductive-pattern-formed housing indicates a housing in which a conductive pattern is formed. Note, however, that the structure of the present invention is not limited to such a housing, but may be a member other than a housing of an electronic device.

The structure of the present invention is configured such that the conductive pattern is sandwiched between the first resin layer and the second resin layer. This makes it possible to prevent an exposure of the conductive pattern to the outside. Accordingly, it becomes possible to ensure a fine appearance and to prevent damage, deformation, and deterioration, and the like of the conductive pattern.

Both of the first resin layer and the second resin layer are injection-molded products. The first resin layer and the second resin layer may be made of the same resin or alternatively, different resins, respectively. A resin for forming each of the first resin layer and the second resin layer can be, for example, one or more kinds of resins selected from among acrylonitrile-butadiene-styrene resin (ABS), polycarbonate-acrylonitrile-butadiene-styrene resin (PC-ABS), polycarbonate (PC), acrylonitrile-styrene resin (AS), polyethylene (PE), polypropylene (PP), polystyrene (PS), methacrylate resin (PMMA) and the like, but the resin is not limited to these kinds of resins. Further, other materials such as glass can be blended for the purpose of increasing strength of the resin.

In one aspect, the first resin layer may be made of a resin that has a higher heat resistance than a resin which the second resin layer is made of. This makes it possible to prevent the resins that form the first resin layer and the second resin layer from excessively fusing to each other by melting in forming the second resin layer. For example, PC can be used as the resin for forming the first resin layer and ABS can be used as the resin for forming the second resin layer.

The conductive pattern is a pattern which is made of a conductor and which is formed on a surface of the first resin layer. The conductor is not especially limited in kind as long as the conductor has a conductive property. Examples of the conductor encompass metals such as copper, iron, nickel, and gold, conductive polymers, and conductive carbons. Further, a method of forming the conductive pattern is not especially limited. For example, the conductive pattern may be formed (i) by plating metal on a surface of the first resin layer, (ii) by printing a conductive paste having the conductor on the surface of the first resin layer, or (iii) by bonding, onto the surface of the first resin layer, a flexible thin-film conductive body made of, for example, copper foil. Further, the conductor used in forming the conductive pattern is not limited to one kind. The conductive pattern may be formed by combining a plurality of conductors, for example, by gold-plating on a copper pattern.

For example, in one embodiment, the conductive pattern can be formed by use of a Laser Direct Structuring (LDS) method. In other words, the conductive pattern can be preferably formed as follows. First, organic metal is blended in advance in the resin for forming the first resin layer, and a region of the surface of the first resin layer, to which region the conductive pattern is to be formed, is irradiated with a laser beam. This causes the organic metal to be precipitated to the region irradiated with the laser beam. Further, the region irradiated with the laser beam is finely roughened (made uneven). As a result, the organic metal is bound to the region irradiated with the laser beam, so that the conductive pattern is preferably formed. Alternatively, in another embodiment, the conductive pattern may be formed by use of a Direct Printed Antenna (DPA) method. In the DPA method, a printing plate for forming the conductive pattern is prepared in advance, and then a conductive pattern shape is transferred from the printing plate to a resin surface by use of a pad or the like.

By use of any of the above methods, especially the LDS method, the first resin layer and the conductive pattern very tightly adhere to each other, because the conductive pattern is formed on the surface of the first resin layer through laser irradiation.

Further, the structure of the present invention can be produced by, for example, the following steps. First, the first resin layer having a penetrating through hole is formed in a desired shape by use of a publicly known injection molding technique (the step of forming a first resin layer). Next, the conductive pattern is formed on the surface of the first resin layer by use of any of the above methods (the step of forming a conductive pattern). Then, the second resin layer is formed on the first resin layer so as to sandwich the conductive pattern between the second resin layer and the first resin layer and form a lamination (the laminating step). In the laminating step, the second resin layer is preferably formed by insert molding so as to be integrally formed with the first resin layer that has already been formed. In other words, in a state where the first resin layer having the conductive pattern is set in a molding die, the second resin layer is formed (insert molding). This allows the first resin layer and the second resin layer to preferably adhere (bond) to each other in a region where the conductive pattern including a missing part is not present.

Embodiment 1

Figure 1:
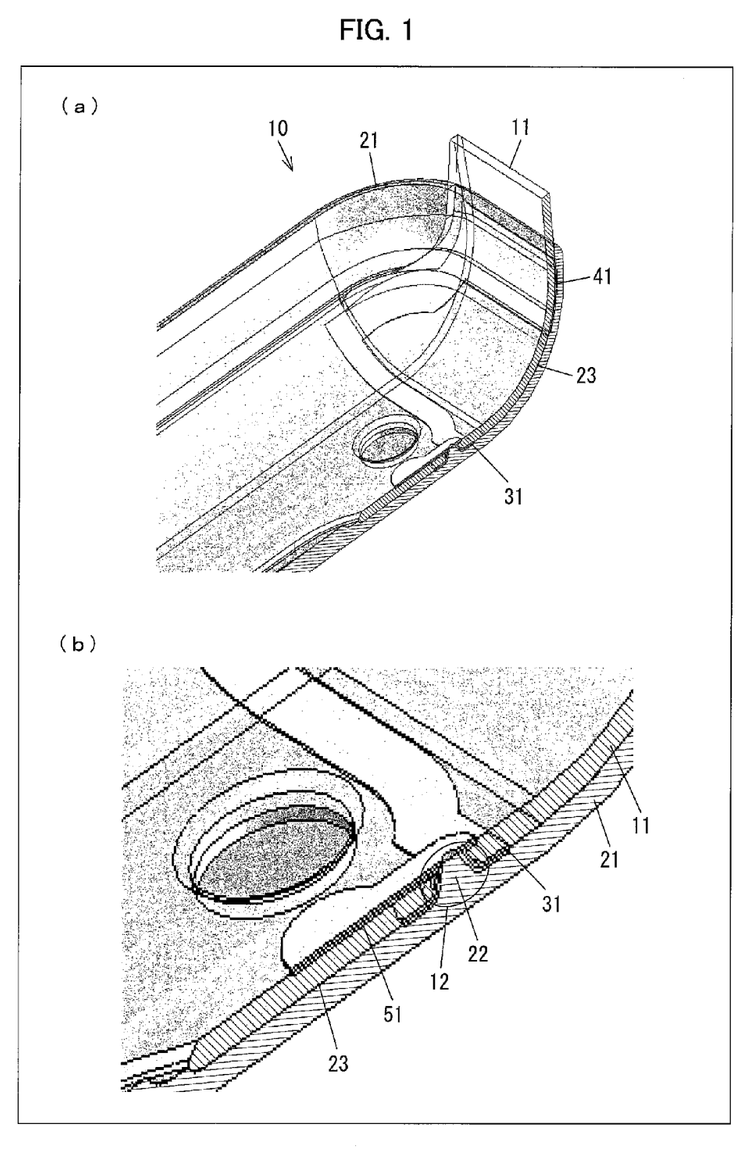

(a) of FIG. 1 is a partial-cutaway perspective cross-sectional view illustrating a schematic configuration of a structure 10 of the present embodiment. As illustrated in (a) of FIG. 1, the structure 10 includes a first resin layer 11, a second resin layer 21, a conductive pattern 31, and a conductive pattern 41. The conductive pattern 41 is provided between the first resin layer 11 and the second resin layer 21 and electrically connected with the conductive pattern 31. Note that there is a portion where no conductive pattern 41 is formed in a boundary portion between the first resin layer 11 and the second resin layer 21, and this portion having no conductive pattern 41 is referred to as an interface 23 between the first resin layer 11 and the second resin layer 21.

(b) of FIG. 1 is a magnified view illustrating the vicinity of a through hole 12 of the first resin layer 11 and a protrusion 22 of the second resin layer 21. The through hole 12 is a first through hole. A surface of the first resin layer 11, which surface is in contact with the second resin layer 21, is defined as a first surface. A surface opposite to the first surface is defined as a second surface. The second surface is a surface inside a housing constituted with the structure 10. The through hole 12 is provided so as to penetrate the first surface and the second surface of the first resin layer 11. In other words, openings of the through hole 12 are formed in the first surface and the second surface of the first resin layer 11, respectively.

As illustrated in (b) of FIG. 1, the conductive pattern 31 is provided to the through hole 12 and to rims of the openings of the through hole 12, which openings are formed in the first surface and the second surface of the first resin layer 11, respectively. The conductive pattern 31 is formed in accordance with a shape of the through hole 12, and like the through hole 12, preferably penetrates the first resin layer 11. In other words, the conductive pattern 31 can be expressed to electrically connect, via the through hole 12, the conductive pattern 51 provided to a second surface side of the first resin layer 11 and the conductive pattern 41 provided to a first surface side of the first resin layer 11.

Both of the conductive pattern 41 and the conductive pattern 51 are formed in the same production process as the conductive pattern 31. That is, the conductive pattern 31 is integrally formed with the conductive pattern 41 and the conductive pattern 51. In the present embodiment, the conductive pattern 31, the conductive pattern 41 and the conductive pattern 51 each has a different function, and therefore, are expressed as three divisional conductive patterns. However, boundaries between the conductive pattern 31 and the conductive pattern 51 and between the conductive pattern 41 and the conductive pattern 31 are not clearly defined. The above three conductive patterns are electrically connected with one another. Therefore, an electric power supplied to the conductive pattern 51 is supplied to the conductive pattern 41.

The second resin layer 21 is formed by forming a layer of the resin on the first surface of the first resin layer 11 on which the conductive pattern 41 is provided. In this case, a portion of the resin forming the second resin layer 21 is filled in the conductive pattern 31 which is formed in accordance with the shape of the through hole 12. In other words, the second resin layer 21 has the protrusion 22 whose shape matches with the shape of the through hole 12. Note that the protrusion 22 is a first protrusion.

In the present embodiment, the through hole 12 of the first resin layer is configured such that an area of a cross section taken along a direction vertical to a penetration direction of the through hole 12 becomes smaller as the cross section is farther away in the penetration direction from the second resin layer 21. In other words, the through hole 12 has a truncated cone shape in which a tip end of the through hole 12 is smaller in size than a base. The resin forming the through hole 12 and the second resin layer 21 is easily and uniformly filled in the entire through hole 12 because the conductive pattern 31 is formed in accordance with such a shape of the through hole 12 and penetrating the first resin layer 11. Note that the shape of the through hole provided to the first resin layer of the structure 10 is not limited to the above shape. Further, a shape of a cross section taken along the direction vertical to the penetration direction of the through hole is not limited to a circular shape, but can be any shape. In addition, in a case where the conductive pattern 31 is formed by use of the LDS method, an angle made between the penetration direction of the through hole 12 having a truncated cone shape and a side surface of the through hole 12 is, in general, preferably 10 degrees or more, and more preferably 30 degrees or more, so as to make it easy to carry out laser irradiation. According to the configuration, it is possible to successfully carry out the LDS method.

Advantages of Embodiment 1

The structure 10 is configured such that the conductive pattern 31 integrally formed with the conductive pattern 41 is drawn from the first surface side of the first resin layer 11 to the second surface side of the first resin layer 11. As a result of such integral formation of the conductive pattern 31 and the conductive pattern 41, the conductive pattern 41 is adhered to the first resin layer 11. This yields an effect that the conductive pattern 41 is less likely to peel off from the first resin layer 11.

Further, the second resin layer 21 is provided with the protrusion 22 whose shape matches with the shape of the through hole 12. Accordingly, the second resin layer 21 fills at least a portion of the through hole 12. This configuration causes the first resin layer to be as if the first resin layer 11 were firmly engaged with the second resin layer 21. This allows the first resin layer 11 and the second resin layer 21 to very tightly adhere to each other, and makes the first resin layer and the second resin layer less likely to peel off from each other at a portion where the conductive patterns 31 and 41 are provided.

As described above, although the conductive pattern 31 intervenes between the first resin layer 11 and the second resin layer 12, the shape of the through hole 12 of the first resin layer 11 and a shape of the protrusion 22 of the second resin layer 21 match with each other and therefore can preferably adhere to each other. Accordingly, the structure 10 configured as described above yields an effect of preventing the first resin layer 11 and the second resin layer 21 from peeling off from each other at a portion where the conductive pattern 41 is provided, in a structure in which the conductive pattern 41 is provided between the first resin layer 11 and the second resin layer 21.

Further, it is possible to prevent a peeling between the first resin layer 11 and the second resin layer 21 even if the conductive pattern 41 is formed over a wide area of the second resin layer 21.

Peeling that occurs between the conductive pattern 41 and the first resin layer 11 and between the first resin layer 11 and the second resin layer 21 significantly affects an antenna property. Generally, it is known that in a case where a dielectric body is placed near an antenna, a permittivity and a dissipation factor of the dielectric body cause a shift in resonance frequency of the antenna and a loss in antenna performance. Therefore, a designer designs an antenna on the premise that a positional relation between an antenna conductor circuit and a package material including a dielectric body is fixed. When the antenna conductor circuit and the package material peel off from each other, a gap is formed between the antenna conductor circuit and the package material. This makes the positional relation between the antenna conductor circuit and the package material unstable. This results in variation in antenna property. The structure 10 makes it possible to prevent peeling between the conductive pattern 41 and the first resin layer 11 and between the first resin layer 11 and the second resin layer 21. Therefore, the structure 10 can suppress such a variation in antenna property.

Further, the structure 10 is configured such that the conductive pattern 31 is fixed by being sandwiched between the through hole 12 and the protrusion 22. This fixation is very firm. Therefore, it is possible to set, to a strong level, the strength of a power feeding spring which supplies an electric power to the conductive pattern 51.

This allows making an adhesion between the second resin layer 21 and the conductive pattern 41 uniform, and consequently, suppressing the variation in resonance frequency of the antenna property.

Further, the structure 10 does not require a reserved area as compared to a technique disclosed in Patent Literature 1. Therefore, a thickness of the structure can be reduced further. Furthermore, the reserved area is often made of a high conductive resin and a metal material. Thus configured reserved area may have a high surface resistance. This is because, as described earlier, the reserved area also contains a non-conductive material as a constituent material. An increase in resistance value of the reserved area, including the surface resistance, results in deterioration of power efficiency in supplying the electric power. The structure 10 is configured such that the conductive pattern 51 and the conductive pattern 41 are connected with each other through the conductive pattern 31 made of a material having a low resistivity. Therefore, it is possible to prevent the deterioration in power efficiency in supplying the electric power. For example, in a case where the structure 10 has the conductive pattern 31 which connects the conductive pattern 51 with a rectangular conductive pattern 41 having a length of 40 mm×a width of 1 mm, such a structure 10 allows suppression of resistance values to approximately 1Ω at respective ends of the conductive pattern 51 and the conductive pattern 41.

Modified Example

Figure 2:
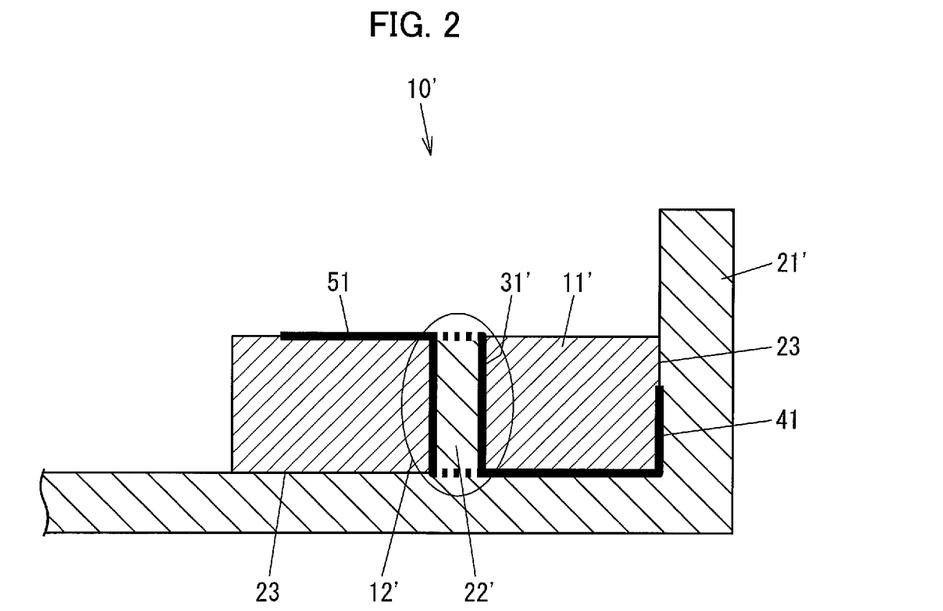
FIG. 2 is a side sectional view illustrating a schematic configuration of a structure of one embodiment (Embodiment 1) of the present invention.

The following description discusses a structure 10' which is a modified example of the structure 10, with reference to FIG. 2. FIG. 2 is a side sectional view illustrating a schematic configuration of the structure 10' of the modified example of the present embodiment. The structure 10 is configured such that the conductive pattern 31 and the conductive pattern 41 are not continuous with each other in a cross section taken through the conductive pattern 31 (see (a) of FIG. 1). However, in practice, the conductive pattern 31 and the conductive pattern 41 are integrally formed and continuous with each other. The structure 10' is also configured such that the conductive pattern 31' and the conductive pattern 41 are integrally formed and continuous with each other. In order to make this clear, FIG. 2 illustrates the conductive pattern 31' and the conductive pattern 41 in a manner such that the conductive pattern 31' and the conductive pattern 41 are continuous with each other. In regard to this point, the same applies to FIGS. 4 to 7 described later.

In the structure 10' of the modified example, a through hole 12' having a cylindrical shape is provided to the first resin layer 11'. In other words, the through hole 12' has a cylindrical shape whose cross section taken along a direction vertical to a penetration direction of the through hole 12' has an area that does not depend on a distance from the second resin layer 21'. Hereinafter, surface corresponding to a side surface of the cylindrical shape is called a side surface of the through hole 12'.

According to the above configuration, a side surface of the protrusion 22' corresponding to the side surface of the through hole 12' is formed so as to be substantially perpendicular to a first surface and a second surface of the first resin layer 11'. In other words, the side surfaces of the through hole 12' and the protrusion 22' do not have slopes that allow the protrusion 22' to easily come off from the conductive pattern 31'. Therefore, the structure 10' yields an effect of more effectively preventing the first resin layer 11' and the second resin layer 21' from peeling off from each other at a portion where the conductive pattern 41 is provided, as compared with the structure 10.

(Production Method)

Figure 3:
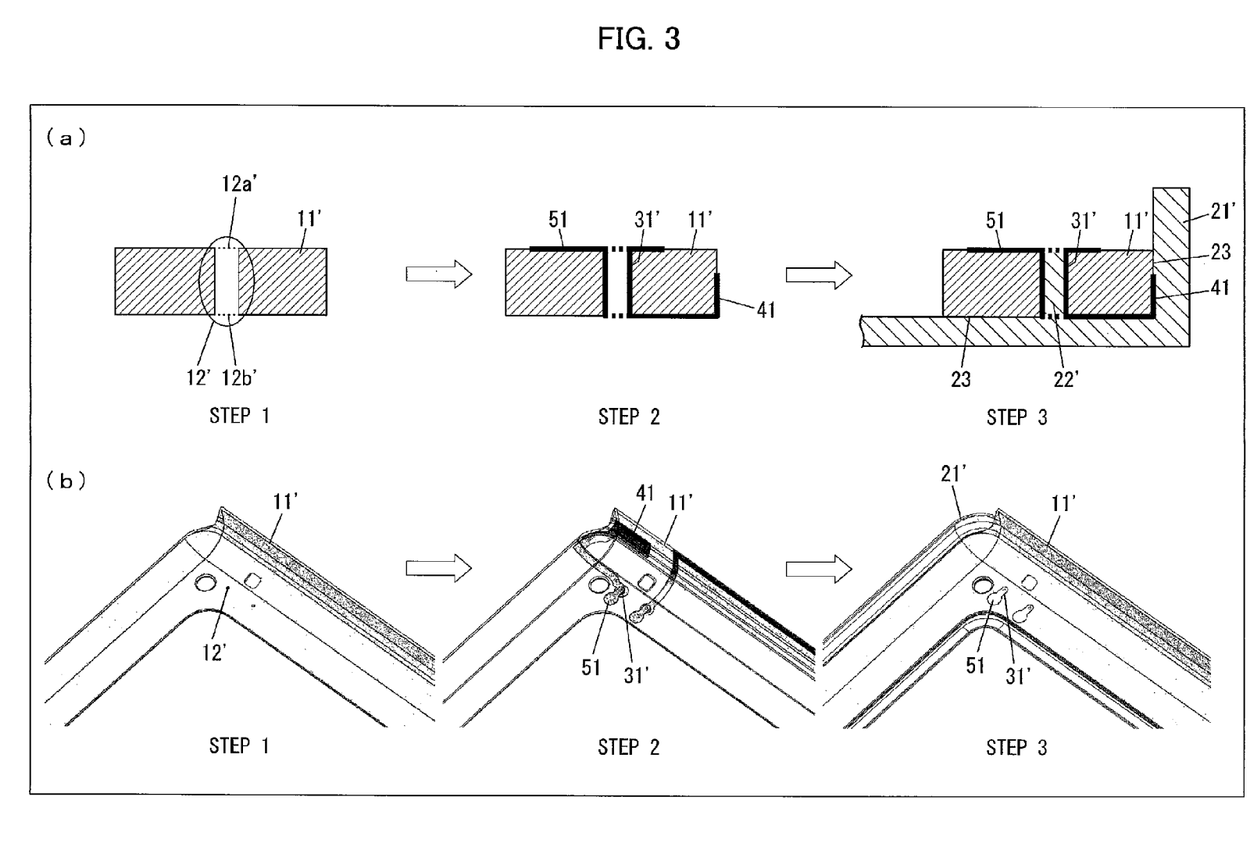
FIG. 3 is a view schematically illustrating an outline of a production process of a structure of one embodiment (Embodiment 1) of the present invention. (a) of FIG. 3 is a side sectional view and (b) of FIG. 3 is a perspective view.

The following discusses a method of producing the structure 10', with reference to FIG. 3. FIG. 3 is a view schematically illustrating an outline of a production process of the structure 10'. (a) of FIG. 3 is a side sectional view of a region in the vicinity of the through hole 12 in the structure 10' and (b) of FIG. 3 is a perspective view of a region including the conductive pattern 41 and the conductive pattern 51 of the structure 10'.

At a production step 1, the first resin layer 11' provided with the penetrating through hole 12' is formed. Production steps herein are discussed by raising, as an example, the through hole 12', although in (b) of FIG. 3, the first resin layer has two through holes. Note that out of openings that the through hole 12' forms to the first resin layer 11', an opening formed in the second surface of the first resin layer 11' is referred to as an opening 12a' and an opening formed in the first surface of the first resin layer 11' is referred to as an opening 12b'.

At a production step 2, the conductive pattern 31', the conductive pattern 41, and the conductive pattern 51 are formed to the first resin layer 11' by use of, for example, plating. More specifically, the conductive pattern 51 is formed on the second surface of the first resin layer 11', the conductive pattern 41 is formed on the first surface of the first resin layer 11', and the conductive pattern 31' is formed on the side surface of the through hole 12', a rim of the opening 12a', and a rim of the opening 12b'.

At a production step 3, the second resin layer 21' is formed so as to sandwich the conductive pattern 41 with the first resin layer 11'. When a resin for forming the second resin layer 21' is injected into a molding die, the resin is also filled in a penetrating part of the penetrating conductive pattern 31'. In this case, gas such as air present in the vicinity of the conductive pattern 31' is exhausted through the penetrating part of the conductive pattern 31'. Therefore, the resin for forming the second resin layer 21' is easily and uniformly filled in the penetration part of the conductive pattern 31. A top end of the conductive pattern 31' may be configured to be closed, if in forming the second resin layer 21', the resin can be filled in an inner side of the conductive pattern 31' so that no residual gas such as air is left in the inner side of the conductive pattern 31'.

Embodiment 2

Figure 4:
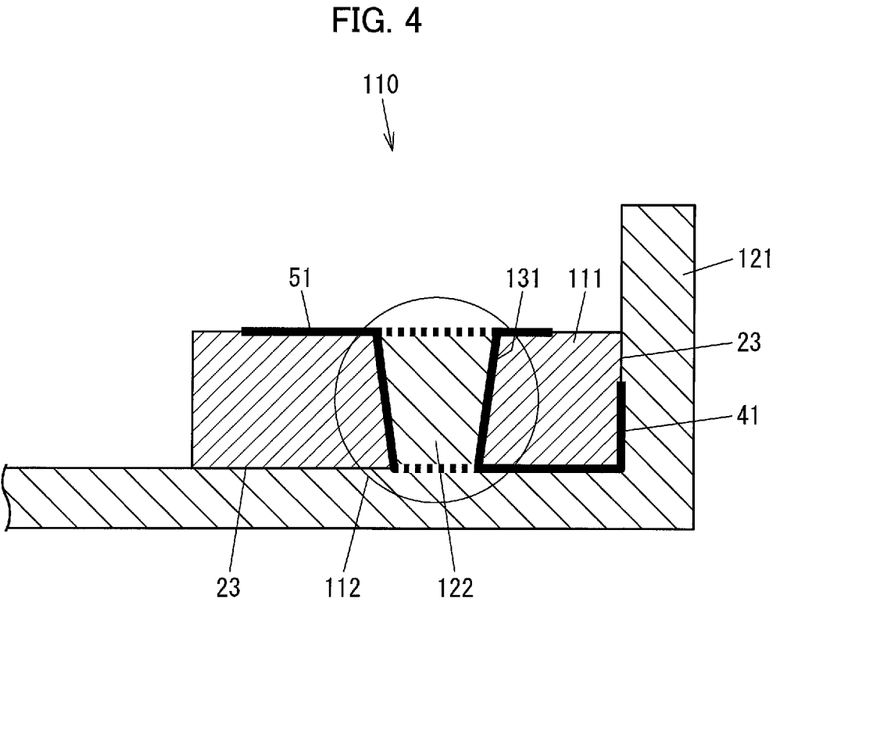
FIG. 4 is a side sectional view illustrating a schematic configuration of a structure of one embodiment (Embodiment 2) of the present invention.

FIG. 4 is a side sectional view illustrating a schematic configuration of a structure 110 of the present embodiment. Note that in descriptions of embodiments below, members having identical functions to members discussed in the above embodiment are given identical reference signs, respectively. Thus, descriptions of such members are not repeated.

The structure 110 is different from the structure 10 and the structure 10' of Embodiment 1 in shape of a through hole 112 which is provided to a first resin layer 111. More specifically, the through hole 112 of the first resin layer is configured such that an area of a cross section taken along a direction vertical to a penetration direction of the through hole 112 becomes larger as the cross section is farther away in the penetration direction from a second resin layer 121. In other words, top ends of the through hole 112 and a protrusion are configured to be larger than a base of the through hole 112. Accordingly, in the structure 110, the through hole 112 and the protrusion 122 are configured such that the protrusion 122 is difficult to come off from the conductive part 131.

Advantages of Embodiment 2

The structure 110 is configured such that the protrusion 122 of the second resin layer 121 is more difficult to come off from the through hole 112 and the conductive part 131 and more firmly fixed to the through hole 112 and the conductive part 131, as compared with the structure 10 and the structure 10' of Embodiment 1. The configuration allows setting, to a stronger level, the strength of the power feeding spring which supplies an electric power to the conductive pattern 51. In other words, it is possible to further improve uniformity of an adhesion between the second resin layer 121 and the conductive pattern 41. This consequently makes it possible to further suppress a variation in resonance frequency of an antenna property of the conductive pattern 41.

Embodiment 3

Figure 5:
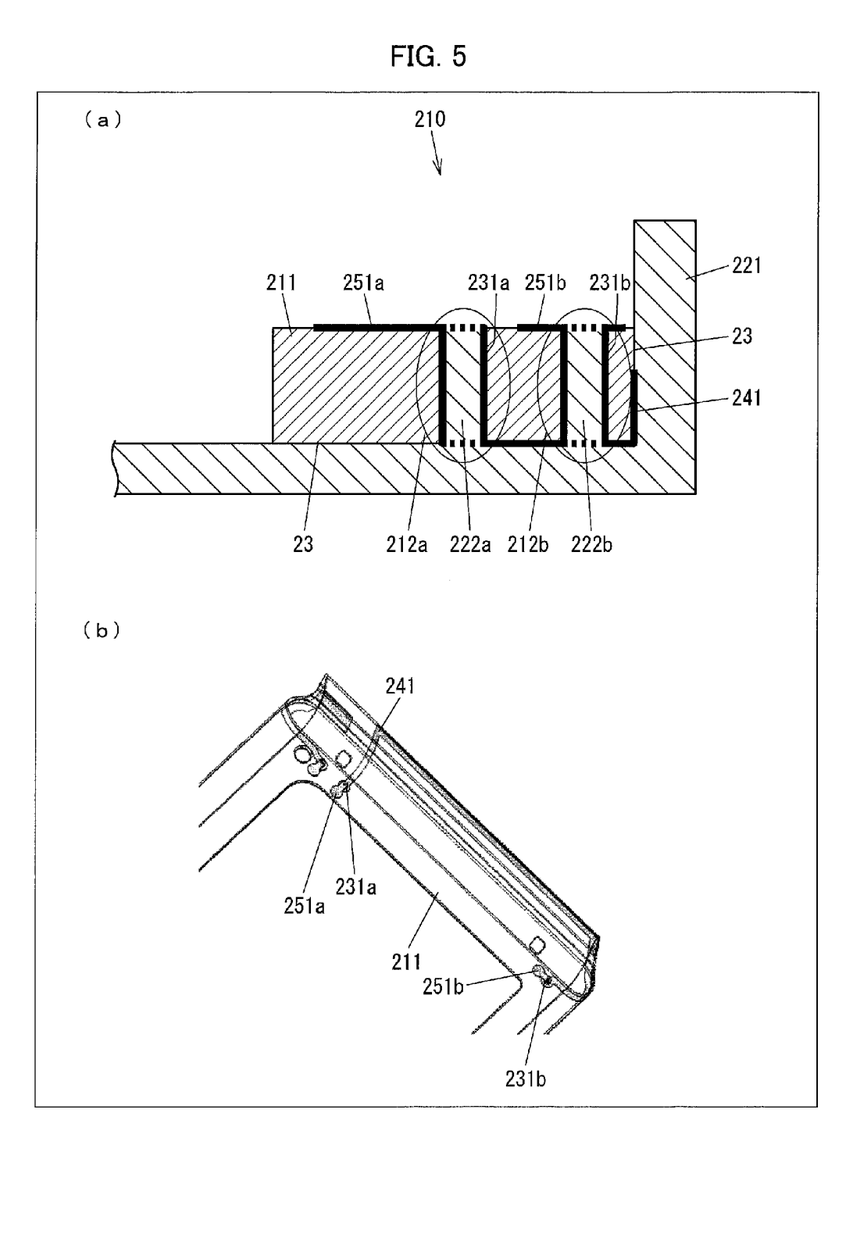
FIG. 5 is a side sectional view illustrating a schematic configuration of a structure of one embodiment (Embodiment 3) of the present invention.

FIG. 5 is a view illustrating a schematic configuration of a structure 210 of the present embodiment. (a) of FIG. 5 is a view illustrating a state in which members provided along a side cross section of the structure 210 is projected and (b) of FIG. 5 is a perspective view.

The structure 210 includes a first resin layer 211 and a second resin layer 221. The first resin layer 211 is provided with a first through hole 212a and a second through hole 212b, and the second resin layer 221 is provided with a first protrusion 222a and a second protrusion 222b. A conductive pattern 231a is provided to the first through hole 212a and rims of openings formed by the first through hole 212a. Similarly, a conductive pattern 231b is provided to the second through hole 212b and to rims of openings formed by the second through hole 212b. The first protrusion 222a has a shape that matches with a shape of the first through hole 212a, and the second protrusion 222b has a shape that matches with a shape of the second through hole 212b. Further, a conductive pattern 241 provided between the first resin layer 211 and the second resin layer 221 electrically connects the conductive pattern 231a and the conductive pattern 231b. Furthermore, (i) the conductive pattern 251a which is electrically connected with the conductive pattern 231a and (ii) the conductive pattern 251b which is electrically connected with the conductive pattern 231b are formed on a second surface of the first resin layer 211.

The structure 210 of Embodiment 3 is different from the structure of each embodiment described earlier in that the structure 210 is configured such that both ends of the conductive pattern 241 each are fixed to the first resin layer 211 and the second resin layer 221. In detail, an end of the conductive pattern 241 is connected with the conductive pattern 231a and another end of the conductive pattern 241 is connected with the conductive pattern 231b. The conductive pattern 231a is sandwiched between the first through hole 212a and the first protrusion 222a, so that the conductive pattern 231a is firmly fixed to the first resin layer 211 and the second resin layer 221. In a similar manner, the conductive pattern 231b is also firmly fixed to the first resin layer 211 and the second resin layer 221.

Advantages of Embodiment 3

As describe above, the structure 210 is configured such that both ends of the conductive pattern 241 each are firmly fixed to the first resin layer 211 and the second resin layer 221. In a case where the conductive pattern 241 is used as an antenna, it is possible to improve uniformity of an adhesion between the conductive pattern 241 and the second resin layer 221 because not only a power feeding section which supplies an electric power but also an end of the antenna can be firmly fixed. Further, typically, the end of the antenna is often provided to a rim region of the structure 210. Such firm fixation of the end of the antenna makes it possible to further suppress a variation in resonance frequency of an antenna property of the conductive pattern 241. This consequently makes it possible to further stabilize the antenna property of the conductive pattern 241.

Embodiment 4

Figure 6:
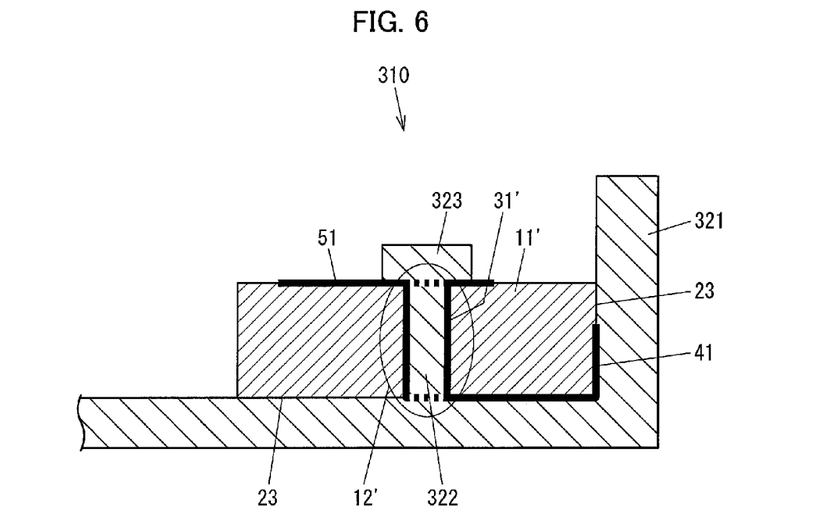
FIG. 6 is a side sectional view illustrating a schematic configuration of a structure of one embodiment (Embodiment 4) of the present invention.

FIG. 6 is a side sectional view illustrating a schematic configuration of a structure 310 of the present embodiment. A configuration of the structure 310 is similar to that of the structure 10' of the modified example of Embodiment 1. However, the structure 310 is different from the structure 10' in that the structure 310 has a plug-form part 323 which is provided so as (i) to adhere, at least via a conductive pattern 31', to a rim of an opening formed by a through hole 12' and (ii) to cover the through hole 12'. The rim of the opening indicates a rim of an opening that is formed in a second surface of a first resin layer 11'. The plug-form part 323 can be formed, for example, by spilling over a resin from a penetrating penetration part of a conductive pattern 31' at, for example, the step of forming a second resin layer 321. Note that the plug-form part 323 is not limited in shape, but may be configured to have any shape as long as the plug-form part 323 at least covers the through hole 12'.

Advantages of Embodiment 4

According to the above configuration, the plug-form part 323 causes the conductive pattern 31' of the structure 310 to be more firmly fixed to the first resin layer 11' and the second resin layer 321. Further, the plug-form part 323 prevents (i) deterioration in adhesion between (a) the protrusion 322 and (b) the conductive pattern 31' and the first resin layer 11' and (ii) consequent loosening of fixation between (a) the protrusion 322 and (b) the conductive pattern 31' and the first resin layer 11'. In a case where the conductive pattern 41 is used as an antenna, it is possible to further improve uniformity in adhesion between the conductive pattern 41 and the second resin layer 221. This is because a power feeding section which supplies an electric power can be more firmly fixed. Consequently, it is possible to further suppress a variation in resonance frequency of an antenna property of the conductive pattern 41, and therefore, to further stabilize the antenna property of the conductive pattern 41.

Further, the plug-form part 323 may be formed in a region that is larger than a region where the conductive pattern 31' is formed. According to the configuration, the plug-form part 323 made of resin and the first resin layer 11' directly adhere to each other without the presence of the conductive pattern 31' between the plug-form part 323 and the first resin layer 11'. Therefore, this configuration allows further increasing an effect yielded by the structure 310.

Embodiment 5

Figure 7:
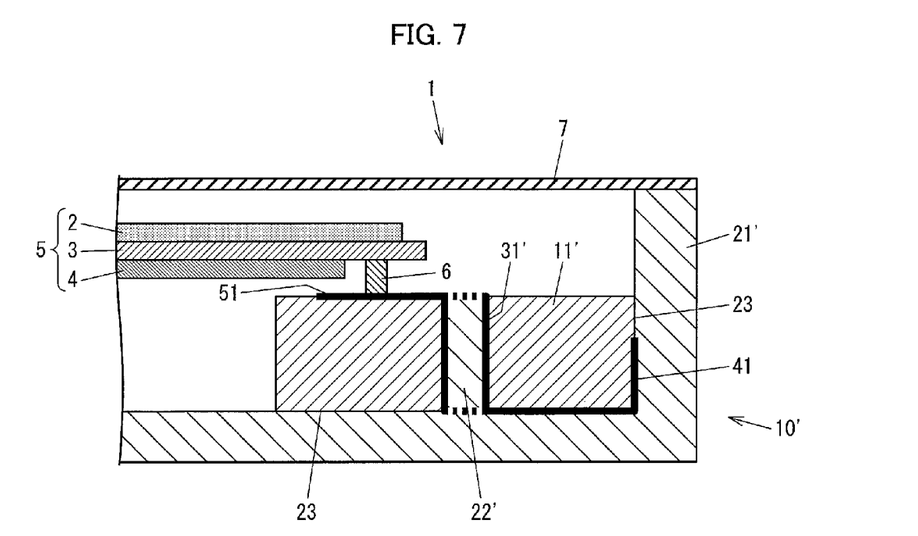
FIG. 7 is a side sectional view illustrating a schematic configuration of a wireless communication apparatus of one embodiment (Embodiment 5) of the present invention.

The following discusses a configuration in which any of the structures discussed in the above embodiments is incorporated into an electronic device. The present embodiment discusses, as one example, a configuration of a wireless communication apparatus 1 into which a structure 10' is incorporated, with reference to FIG. 7. FIG. 7 is a schematic view schematically illustrating a configuration of the wireless communication apparatus 1. The wireless communication apparatus 1 includes the structure 10' and an internal device 5. The structure (a lower housing) 10' constitutes a housing of the wireless communication apparatus 1 together with an upper housing 7. Further, the internal device 5 includes an electronic circuit section 2, an internal board 3, and a surface mounted component 4. The internal board 3 is a board on which the surface mounted component 4 and the electronic circuit section 2 are to be mounted. The surface mounted component 4 and the electronic circuit section 2 are configured to realize each function of the wireless communication apparatus 1. Note that the electronic circuit section 2 is connected with a conductive pattern 41 via a power feeding spring 6, a conductive pattern 51, and the like.

Advantages of Embodiment 5

According to the above configuration, the conductive pattern 31' is firmly fixed to a first resin layer 11' and a second resin layer 21'. Thus, it is possible to firmly fix, to the conductive pattern 51, the power feeding spring 6 which supplies an electric power to the conductive pattern 41. That is, it is possible to further improve uniformity of an adhesion between the conductive pattern 41 and the second resin layer 21'. This consequently makes it possible to further suppress a variation in resonance frequency of an antenna property of the conductive pattern 41, and therefore, to further stabilize the antenna property of the conductive pattern 41. As illustrated especially in FIG. 7, the conductive pattern 51 is a connecting part for connecting the conductive pattern 41 with the internal board 3. A variation in adhesion between the first resin layer 11' with the conductive pattern 51 which serves as the connecting part causes a variation in antenna performance.

Further, preferably, an antenna is provided as far away from the internal device 5 as possible in a typical antennal design, as illustrated in FIG. 7. The conductive pattern 41 can be provided on a more outer side, by providing the conductive pattern 31' as close as possible to the internal device 5. Typically, the conductive pattern 51 is often designed so as to be a circular shape having a diameter of approximately 2 mm which circular shape has a center at a contact point of the conductive pattern 51 and the power feeding spring 6. Therefore, in the wireless communication apparatus 1, the conductive pattern 31' can be provided at a position that is approximately 1 mm to 3 mm distant from a center of the contact point with the power feeding spring 6.

CONCLUSION

A structure (10) according to a first aspect of the present invention includes: a first resin layer (11) on whose surface a conductive pattern (41) is formed, and a second resin layer (21) formed on the first resin layer (11) so that the conductive pattern (41) is sandwiched between the first resin layer (11) and the second resin layer (21), the first resin layer (11) being provided with a first through hole (12), the conductive patterns (31, 41, 51) extending from a first surface of the first resin layer (11) to a second surface of the first resin layer (11) through the first through hole (12), the first surface being on a side provided with the second resin layer (21), the second surface being on an opposite side to the side provided with the second resin layer (21), the second resin layer (21) having a first protrusion (22) which fills at least a portion of the first through hole (12).

According to the above configuration, in one aspect of the present invention, the protrusion of the second resin layer formed on the first resin layer fills at least a portion of the through hole provided to the first resin layer. Accordingly, the first resin layer and the second resin layer firmly adhere to each other. This yields an effect of preventing the first resin layer and the second resin layer from peeling off from each other at a portion where the conductive pattern is provided.

A structure (110) according to a second aspect of the present invention is preferably configured such that in the first aspect, a top end of a first protrusion (122) is larger than a base of the first protrusion.

According to the above configuration, the first protrusion is configured to be more difficult to come off from the first through hole and the conductive pattern, and accordingly to be firmly fixed to the first through hole and the conductive pattern. This configuration allows, for example, setting, to a stronger level, the strength of the power feeding spring in using the power feeding spring for supplying an electric power to the conductive pattern. Accordingly, it is possible to further suppress a variation in resonance frequency of an antenna property of the conductive pattern.

A structure (210) of a third aspect of the present invention is configured such that, in the first or second aspect, the first resin layer (211) is further provided with the second through hole (212b), the conductive pattern (241) extends, at an end of the conductive pattern (241), from a first surface to a second surface through the first through hole (212a); the conductive pattern (241) extends, at another end side of the conductive pattern (241), from the first surface to the second surface through the second through hole (212b); and the second resin layer (221) is further provided with a second protrusion (222b) which fills at least a portion of the second through hole (212b).

According to the above configuration, the structure has the conductive pattern whose both ends each are firmly fixed to the first resin layer and the second resin layer. This makes it possible to further stabilize the antenna property of the conductive pattern.

A structure of a fourth aspect of the present invention is configured such that, in any one of the first aspect to the third aspect, the first protrusion (322) has a plug-form part (323) on the second surface of the first resin layer, the plug-form part (323) being provided so as to cover the through hole.

According to the above configuration, the plug-form part 323 allows the conductive pattern 31' to be more firmly fixed to the first resin layer 11' and the second resin layer 321. Further, the plug-form part 323 prevents deterioration in adhesion between (a) the protrusion 322 and (b) the conductive pattern 31' and the first resin layer 11'. This makes it possible to further stabilize the antenna property of the conductive pattern.

A wireless communication apparatus (1) of a fifth aspect of the present invention preferably includes: (i) a housing including the structure described in any one of the first aspect to the fourth aspect; and (ii) an antenna including the conductive pattern.

The above configuration yields an effect similar to that of the structure of any one of the first aspect to the fourth aspect.

The present invention is not limited to each embodiment described above, but may be altered within the scope of the claims. An embodiment based on an appropriate combination of technical means respectively described in different embodiments is encompassed in the technical scope of the present invention. Further, a combination of technical means described in the above embodiments can form a new technical feature.

INDUSTRIAL APPLICABILITY

The present invention can be widely applied to various electronic components each utilizing a conductive pattern. In particular, the present invention can be preferably applied to a wireless communication apparatus using a conductive pattern as an antenna element, though not limited to such application.

REFERENCE SIGNS LIST

1 Wireless communication apparatus
10, 110, 210, 310 Structure
11, 111, 211 First resin layer
12, 111, 212 Through hole
21, 121, 221, 321 Second resin layer
22 Protrusion
23 Interface
31, 41, 51 Conductive pattern

The invention claimed is:
1. A structure comprising:
a first resin layer on whose surface the conductive pattern is formed; and a second resin layer formed on the first resin layer so that the conductive pattern is sandwiched between the first resin layer and the second resin layer, the first resin layer being provided with a first through hole,
the conductive pattern extending from a first surface of the first resin layer to a second surface of the first resin layer through the first through hole, the first surface being on a side provided with the second resin layer, the second surface being on an opposite side to the side provided with the second resin layer side,
the second resin layer having a first protrusion which fills at least a portion of the first through hole, wherein:
the first resin layer is further provided with a second through hole; the conductive pattern extends, at an end of the conductive pattern, from the first surface to the second surface through the first through hole;
the conductive pattern extends, at another end side of the conductive pattern, from the first surface to the second surface through the second through hole; and
the second resin layer is further provided with a second protrusion which fills at least a portion of the second through hole, wherein the conductive pattern includes an antenna.

2. The structure according to claim 1, wherein a top end of the first protrusion is
larger than a base of the first protrusion.

3. A wireless communication apparatus comprising: a housing including the structure according to claim 2.

4. The structure according to claim 1, wherein the first protrusion
has a plug-form part on the second surface, the plug-form part being provided so as to cover the first through hole.

5. A wireless communication apparatus comprising: a housing including the structure according to claim 4.

6. A wireless communication apparatus comprising: a housing including the structure according to claim 1.

7. The structure according to claim 2, wherein
the first protrusion has a plug-form part on the second surface, the plug-form part being provided so as to cover the first through hole.

8. The structure according to claim 1, wherein
the first protrusion has a plug-form part on the second surface, the plug-form part being provided so as to cover the first through hole.

9. A wireless communication apparatus comprising: a housing including the structure according to claim 1.

10. A structure comprising:
a first resin layer on whose surface the conductive pattern is formed; and a second resin layer formed on the first resin layer so that the conductive pattern is sandwiched between the first resin layer and the second resin layer, the first resin layer being provided with a first through hole,
the conductive pattern extending from a first surface of the first resin layer to a second surface of the first resin layer through the first through hole, the first surface being on a side provided with the second resin layer, the second surface being on an opposite side to the side provided with the second resin layer side,
the second resin layer having a first protrusion which fills at least a portion of the first through hole,
wherein:
the first resin layer is further provided with a second through hole; the conductive pattern extends, at an end of the conductive pattern, from the first surface to the second surface through the first through hole;
the conductive pattern extends, at another end side of the conductive pattern, from the first surface to the second surface through the second through hole; and
the second resin layer is further provided with a second protrusion which fills at least a portion of the second through hole, wherein the conductive pattern includes an antenna.

* * * * *